United States Patent [19]

Waller, Jr.

[11] Patent Number: 5,402,498
[45] Date of Patent: Mar. 28, 1995

[54] AUTOMATIC INTELLIGENT AUDIO-TRACKING RESPONSE CIRCUIT

[76] Inventor: James K. Waller, Jr., 741 Morgan Hill, Lake Orion, Mich. 48035

[21] Appl. No.: 131,312

[22] Filed: Oct. 4, 1993

[51] Int. Cl.⁶ .............................................. H03G 7/00
[52] U.S. Cl. .................................... 381/106; 84/703
[58] Field of Search .................... 84/703; 381/98, 106, 381/22

[56] References Cited

U.S. PATENT DOCUMENTS 3,808,344  4/1974  Ippolito et al. .................. 84/703

Primary Examiner—Forester W. Isen
Attorney, Agent, or Firm—Frank J. Catalano; Scott R. Zingerman

[57] ABSTRACT

A circuit automatically adjusts in response to an input audio signal to provide a dc control signal having the release characteristics of the input audio signal. The circuit has an input reference node for receiving a reference signal which is a function of the input signal, an output reference node for providing the dc control signal and an intermediate reference node between the input and output reference nodes. One or more diodes connected between the input and intermediate nodes permit forward conduction from the input node to the intermediate node. Components of a first signal path connected between the intermediate and output nodes provide a slow release time when the reference signal has a slow decay envelope. Components of a second signal path connected between the output and input nodes provide a fast release time when the reference signal has a fast decay envelope and cooperate with the first signal path components to provide a corresponding variable intermediate range of release times when the reference signal has a variable intermediate decay envelope. Components of a third signal path connected between the intermediate and output nodes permit forward conduction from the intermediate node to the output node to provide a fast attack time when the reference signal has a fast increase envelope and cooperate with the first signal path to provide a corresponding variable intermediate range of attack times when the reference signal has a variable intermediate increase envelope.

17 Claims, 2 Drawing Sheets

AUTOMATIC INTELLIGENT AUDIO-TRACKING RESPONSE CIRCUIT

BACKGROUND OF THE INVENTION

This invention relates generally to signal processing equipment and more particularly concerns circuits providing program-dependent response characteristics for signal processing devices.

In the field of audio signal processing equipment, it has been desirable for many years to provide program-dependent response characteristics for signal processors such as compressors, dynamic filters, expanders, noise gates, limiters and virtually any application which involves controlling the dynamic content of an audio signal. The advantages of providing a program-dependent response become obvious under specific dynamic conditions. Optimal response characteristics for some audio signals may require a very fast attack and/or release time and for others may require a very slow attack and/or release time. In dealing with the manipulation of the dynamic content of an audio signal by compression, expansion, limiting or the like, it is very desirable to have a circuit which automatically adjusts its attack and/or release characteristics based on the dynamic nature of the input signal. A long, sustained note from an instrument such as a piano, applied to the input of a downward expander, for example, would require a very long release time-constant to avoid any undesirable pumping effects and provide a smooth decay of the audio signal. Conversely, a short, staccato signal will require a very short release time-constant to avoid any breathing effects, as a release time that is not short enough will allow a burst of noise to pass before the expander actually closes. In compression/limiting applications, it is ideal to provide a circuit which tracks the attack characteristics of the input envelope because it is desirable to have a compressor respond slowly to minor changes in the audio. But if the audio suddenly gets loud, the compressor should have an equally fast attack time-constant.

Such an improvement in the realm of dynamic control over attack and release time-constants would also lend itself to dynamic filtering applications, as the principle side effects of pumping and breathing would be greatly reduced by the increased dynamic sensitivity to the input signal.

Previous attempts to achieve program-dependant release characteristics have fallen far short of ideal results. One compressor currently available boasts a program-dependent release characteristic from 200 milliseconds to one second. Some of the most common compressors currently on the market state in their product literature that their attack time is based on the use of RMS detection in their design, and the design of the RMS detector inherently provides an attack time-constant of 15 mS for 10 dB of gain change, 5 mS for 20 dB of gain change and 3 mS for 30 dB of gain change. While these compressors provide a 5:1 ratio of change, program-dependent release characteristics well beyond this range and even in excess of 1000:1 are desirable.

It is, therefore, an object of this invention to provide an automatic intelligent audio tracking response circuit having program-dependent attack and release characteristics for virtually all dynamic processing equipment. It is also an object of the present invention to provide an automatic intelligent audio tracking response circuit having program-dependent attack and release characteristics which can be used either individually or simultaneously. It is another object of the present invention to provide an automatic intelligent audio tracking response circuit having a ratio of attack time exceeding 1000:1 and a ratio of release time exceeding 1000:1. It is a further object of this invention to provide an automatic intelligent audio tracking response circuit which lends itself to easy implementation for virtually all dynamic processing applications including, but not limited to, downward expanders, linear expanders, compressors, limiters, enhancers and the like. And it is also an object of this invention to provide an automatic intelligent audio-tracking response circuit which is inexpensive, comprised of a minimal number of parts, easy to implement and usable with virtually any type of dynamic processing application.

SUMMARY OF THE INVENTION

In accordance with the invention a circuit automatically adjustable in response to an input audio signal to provide a dc control signal having the release characteristics of the input audio signal has an input reference node for receiving a reference signal which is a function of the input signal, an output reference node for providing the dc control signal and an intermediate reference node between the input and output reference nodes.

One or more diodes connected between the input and intermediate nodes permit forward conduction from the input node to the intermediate node. Components of a first signal path connected between the intermediate and output nodes provide a slow release time when the reference signal has a slow decay envelope. Components of a second signal path connected between the output and input nodes provide a fast release time when the reference signal has a fast decay envelope and cooperate with the first signal path components to provide a corresponding variable intermediate range of release times when the reference signal has a variable intermediate decay envelope.

Components of a third signal path connected between the intermediate and output nodes permit forward conduction from the intermediate node to the output node to provide a fast attack time when the reference signal has a fast increase envelope and cooperate with the first signal path to provide a corresponding variable intermediate range of attack times when the reference signal has a variable intermediate increase envelope.

BRIEF DESCRIPTION OF THE DRAWINGS

Other objects and advantages of the invention will become apparent upon reading the following detailed description and upon reference to the drawings in which.

While the invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

DETAILED DESCRIPTION

Figure 1:
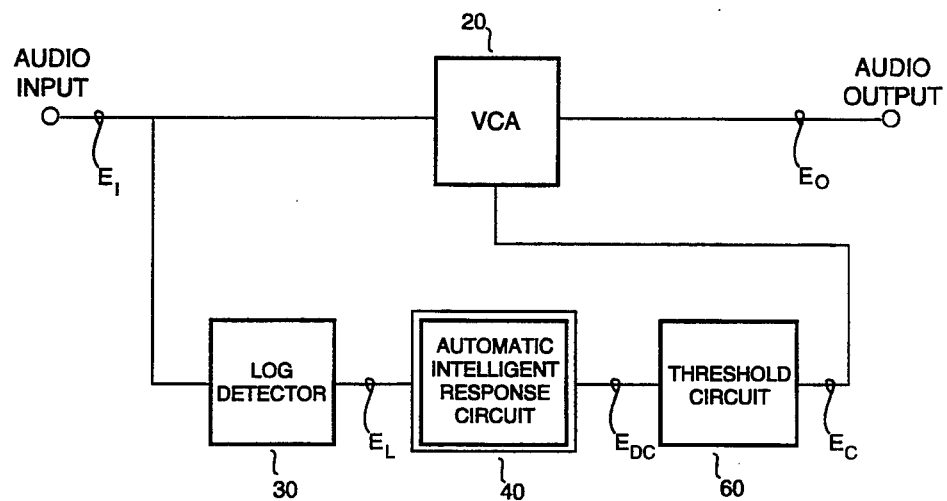
FIG. 1 is a block diagram illustrating use of the automatic intelligent audio-tracking response circuit to control a VCA.

FIG. 1 illustrates a basic circuit configuration that can provide downward expansion, compression, limiting and the like if either a positive-going or negative-going DC control voltage is provided to a VCA 20. In this preferred embodiment, an input signal $E_I$ is applied to both the voltage-controlled amplifier 20 and a log-based detector circuit 30. Other detection circuits such as true rms, peak or averaging detection circuits could be used instead of the log-based detector circuit 30. The log-based detector circuit 30 is used to convert the audio input $E_I$ to a reference signal $E_L$ that is logarithmically related to the audio input $E_I$. The intelligent response circuit 40 converts that signal $E_L$ into a DC signal $E_{DC}$ to provide the attack and release characteristics of the audio input $E_I$. The threshold circuit 60 then determines the point at which this signal $E_{DC}$ is passed on to the VCA 20 as control signal $E_C$ to control the dynamic response of the VCA 20.

Figure 2:
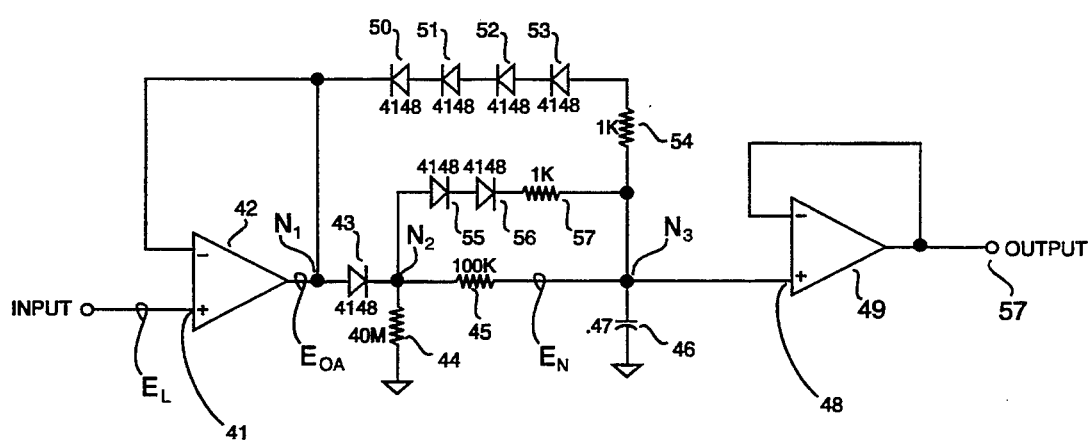
FIG. 2 is a preferred embodiment of the automatic intelligent audio-tracking response circuit.

FIG. 2 is a schematic diagram of the automatic intelligent audio tracking response circuit 40. The output $E_L$ from the log-based detector 30 is applied to the positive pin 41 of an operational amplifier 42. In some applications, an additional RC circuit can be connected at the input 41 which would define the fastest release characteristics that could be achieved from the circuit. The signal $E_L$ is buffered via the operational amplifier 42 and the output $E_{OA}$ of the amplifier 42 fed through an input node $N_1$ to a diode 43. With a positive-going voltage, the diode 43 will provide forward conduction through an intermediate node $N_2$ and a resistor 45 connected in series between the intermediate node $N_2$ and a voltage or output node $N_3$ and positively charge a grounded capacitor 46. The DC voltage present at the output node $N_3$ is connected to the positive input 48 of an operational amplifier 49. This amplifier 49 operates as a voltage-follower and is necessary to provide the change of impedance required to drive the threshold circuit 60. The very high input impedance of the operational amplifier 49 has no effect on the release characteristics of the automatic intelligent audio tracking response circuit 40, and the amplifier 49 buffers this signal to provide a low output impedance to drive the threshold circuit 60 so as to avoid any interaction between the threshold circuit 60 and the release characteristics of the automatic intelligent audio-tracking response circuit 40.

With a signal $E_L$ that has a very slowly decaying envelope, the release time constant is defined by a grounded resistor 44 connected at the intermediate node $N_2$ between the diode 43 and the series resistor 45 and by the series resistor 45 and the grounded capacitor 46. The basic equation used to determine the time-constant is $T=RC$, where $T=$time, $R=$the resistance value and $C=$the capacitance value. Therefore, based on the values shown in FIG. 2, the resistors 44 and 45 together equal a resistance of 40.1M. This 40.1M resistance multiplied by the capacitance value of the capacitor 46 ($0.47^{-6}$) results in a time-constant of 18.8 seconds. The value of the grounded resistor 44 can be changed to alter the slowest possible release time that the circuit 40 can achieve.

Should the signal $E_L$ have a very fast decay, the audio envelope stops very abruptly. The voltage $E_{OA}$ at the output of the operational amplifier 42 will drop rapidly in this case. A series of diodes 50, 51, 52 and 53 provides a dynamic resistance as the voltage $E_{OA}$ at the output of the operational amplifier 42 drops below the voltage $E_N$ held at the output node $N_3$. The farther this voltage $E_{OA}$ drops below the voltage $E_N$ held at the output node $N_3$, the greater the forward conduction through diodes 50, 51, 52 and 53 will increase. When the voltage $E_{OA}$ at the output of the operational amplifier 42 surpasses four diode drops relative to the output node $N_3$, the series of diodes 50, 51, 52 and 53 will saturate and the release time-constant will be predominantly determined by the value of a resistor 54 in series with the diodes 50, 51, 52 and 53. In applications where an RC circuit is applied at the input 41 to determine release time-constant characteristics, the resistor 54 may be omitted. The value of this resistor 54 will determine the fastest release time-constant that the circuit 40 will provide once forward conduction occurs through the series of diodes 50, 51, 52 and 53. This increase in the release characteristics will pull the release down where it will then track the envelope of the signal $E_I$ again if it is slowly decaying. However, if the signal $E_I$ drops instantaneously, the output $E_{OA}$ of the operational amplifier 42 will greatly exceed four diode drops and cause the series of diodes 50, 51, 52 and 53 to turn on completely. The release characteristic will then be defined by the forward conduction of the series of diodes 50, 51, 52 and 53 once they and the capacitor 46 have saturated. Based on the equation $T=RC$, the circuit 40 as shown in FIG. 2 will provide a fastest release time of approximately 470 microseconds. Therefore, with a slowly decaying signal $E_I$, an 18 second release time is possible and, with a very rapidly decaying signal $E_I$, a release time as quick as approximately 470 microseconds is possible. Therefore, the circuit 40 as disclosed in FIG. 2 provides a release time ratio of 40,000:1. With an envelope that is decaying moderately fast or at any rate between the two extremes of 470 microseconds and 28 seconds, the voltage $E_N$ at the output node $N_3$ will start to release and, as the output $E_{OA}$ of the operational amplifier 42 approaches four diode drops negative with respect to the voltage $E_N$ held at the output node $N_3$, will tend to accelerate that release such that it will catch up with the envelope of the audio signal $E_I$. Once this happens, the release time slows down again until the output $E_{OA}$ of the operational amplifier 42 again approaches four diode drops below the voltage $E_N$ held at the output node $N_3$. Therefore, the automatic intelligent audio-tracking response circuit 40 provides not only a very fast and very slow release characteristic, but also truly tracks the envelope of the audio signal $E_I$. This also avoids any pumping effects with audio signals that have long decay times, such as guitars or cymbals.

The window of operation is defined by the volt/decibel response at the input 41 to the operational amplifier 42. For example, if the response at the input 41 is 1 volt/10 dB, a 28 dB window is defined. This means that a 28 dB drop at the input 41 would be required to fully activate the series of diodes 50, 51, 52 and 53 and thus provide the faster release characteristic. This range can be altered by changing the V/dB response at the input 41 or by changing the number of diodes in the circuit path. For example, removing one of the diodes 50, 51, 52 or 53 would shrink the range of operation of the circuit 40 as engaging the faster response would then require a 21 dB drop at input 41. Adding an additional diode to the series will expand this range to 35 dB. It should also be noted that these diodes will be temperature-sensitive in specific applications, although in most applications temperature will have little or no effect on the performance of the circuit 40. Should the disclosed circuit 40 be implemented in an application where the temperature might affect its operating characteristics, there are many commonly known temperature-compensating methods which may be used to prevent severe temperatures from affecting the performance of the circuit 40.

The portion of the circuit 40 which defines the attack time-constant operates similarly to that which defines the release time-constant. With only small increases in the voltage $E_{OA}$ at the output of the operational amplifier 42, forward conduction will occur through the diode 43 connected to the output of the operational amplifier 42 and the attack time-constant will be defined by the value of the series resistor 45. A sharp increase in voltage $E_{OA}$ at the output of the operational amplifier 42 will cause forward conduction to occur through a pair of diodes 55 and 56 and a resistor 57 connected in series with each other and in parallel with the series resistor 45. The parallel resistor 57 defines the fastest attack time-constant the circuit 40 will achieve once forward conduction occurs through the pair of diodes 55 and 56. The window of operation for the attack portion of the circuit 40 is also dependent on the V/dB response at the input 41, as well as the number of diodes in the circuit path. Once again, with a 1 volt/10 dB response at the input 41, a 14 dB increase in signal level would be required to fully activate the pair of diodes 55 and 56 and provide the fastest attack characteristic. If the voltage $E_{OA}$ at the output of the operational amplifier 42 increases, but remains slightly below or approaching 1.4 volts relative to the output node $N_3$, the attack characteristics will be accelerated. This allows for a dynamically-controlled signal processor to respond slowly to minor changes in the audio signal $E_I$, yet initiate a much faster attack for a suddenly loud passage.

Figure 3:
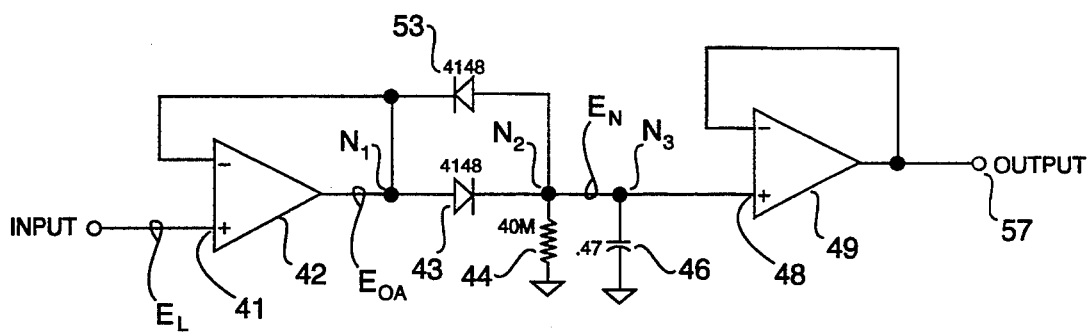
FIG. 3 is one simplified version of the preferred embodiment of FIG. 2.
Figure 4:
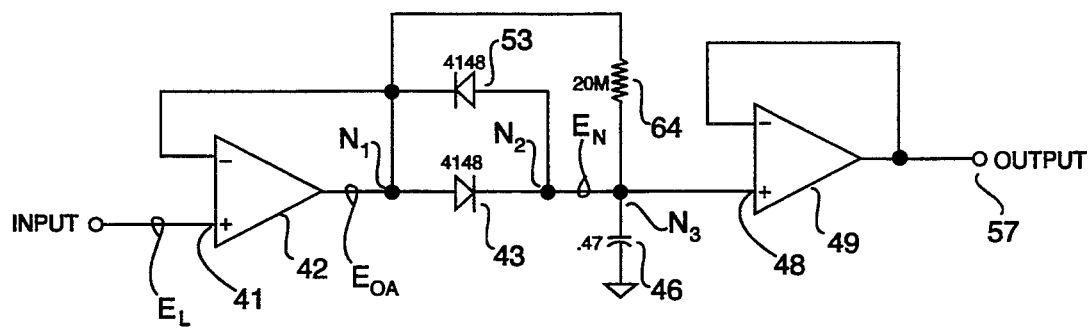
FIG. 4 is another simplified version of the preferred embodiment of FIG. 2.

Turning now to FIGS. 3 and 4, simplified implementations of the preferred embodiment of the invention providing primarily the program-dependent release characteristics of the invention are illustrated. Both require a reduced volt-per-decibel input level in comparison to that required in FIG. 2 and operate optimally with an input response of approximately 0.5 v per 10 dB. Like components are designated by identical reference designations to that of FIG. 2.

Referring to FIG. 3, an input signal $E_L$, which is the output from a log-based detector or other audio detection scheme, is applied to the positive input 41 of operational amplifier 42. In this implementation, it is required that the input signal already be filtered with a time constant providing the fastest release characteristic desirable. The signal $E_L$ is buffered by operational amplifier 42 and the output $E_{OA}$ is fed to an input node $N_1$ and to a diode 43. With a positive-going voltage, the diode 43 will provide forward conduction and positively charge the capacitor 46 at the node $N_2$. The DC voltage present at the output node $N_3$ is connected to the positive input 48 of an amplifier 49. The amplifier 49 operates as a voltage follower, and is necessary to provide the change of impedance required to drive the threshold circuit 60, which follows the automatic intelligent response circuit 40, as shown in FIG. 1. The very high input impedance of the operational amplifier 49 has no effect on the release characteristics of the automatic intelligent response circuit shown in FIG. 3. With a signal $E_L$ having a very slowly decaying envelope, the release time constant is defined by the grounded resistor 44 connected at node $N_3$. With the resistance value of 40M$\Omega$ for the resistor 44 and a value of 0.47 microfarads for capacitor 46, a time constant of 18.8 seconds results. As previously described, the value of the grounded resistor 44 can be changed to alter the slowest possible release time that the circuit can provide. Should the signal $E_L$ have a very fast decay, i.e. the audio signal stops abruptly, the voltage $E_{OA}$ at the output of amplifier 42 will drop rapidly. A diode 53 would then provide a dynamic resistance as the voltage of $E_{OA}$ at the output of the amplifier 42 drops below the voltage $E_N$, which is held at the output node $N_3$. The farther the voltage $E_{OA}$ drops below the voltage $E_N$ held at the output node $N_3$, the greater the forward conduction through the diode 53. When the voltage $E_{OA}$ at the output of amplifier 42 surpasses a diode drop relative to the output node $N_3$, the diode 53 will saturate and the release time constant will be predominantly defined by the release time constant of the input signal from the audio detector.

Referring to FIG. 4, operation is almost identical to that described for FIG. 3. However, the resistor 64 is not connected to ground but alternately connected back to the output of the operational amplifier 42. This will provide a release response that will remain virtually unchanged if the input audio signal has a relatively constant amplitude. However, as the output voltage of the amplifier 42 decreases, the resistor 64 will provide a discharge path for the capacitor 46, providing a long time constant. With the components shown (resistor 64=20M and capacitor 46=0.47 uF) a slow release time constant of 9.4 seconds results. As in FIG. 3, the further the voltage $E_{OA}$ drops below the voltage $E_N$ held at the output node $N_3$, the greater the forward conduction through the diode 53. When the voltage at $E_{OA}$ at the output of amplifier 42 surpasses one diode drop relative to node $N_3$, the diode will saturate and the release time constant will be defined by the time constant of the input audio detector.

It can be seen that the implementations shown in FIGS. 3 and 4 provide release characteristics having a program-dependent release which would track the envelope of the audio input signal. Both FIGS. 3 and 4 can be configured so as to provide release time ratios exceeding 1000:1, as previously discussed in FIG. 2.

Thus, it is apparent that there has been provided, in accordance with the invention, an automatic intelligent audio-tracking response circuit that fully satisfies the objects, aims and advantages set forth above. While the invention has been described in conjunction with specific embodiments thereof, it is evident that many alternatives, modifications and variations will be apparent to those skilled in the art and in light of the foregoing description. Accordingly, it is intended to embrace all such alternatives, modifications and variations as fall within the spirit of the appended claims.

What is claimed is:

1. A circuit automatically adjustable in response to an input audio signal to provide a dc control signal having the release characteristics of the input audio signal comprising:
   an input reference node for receiving a reference signal which is a function of the input signal;
   an output reference node for providing the dc control signal;
   an intermediate reference node between said input and output reference nodes;

diode means connected between said input and intermediate nodes for permitting forward conduction from said input node to said intermediate node;

a first signal path means connected between said intermediate and output nodes for providing a slow release time when said reference signal has a slow decay envelope; and a second signal path means connected between said output and input nodes for providing a fast release time when said reference signal has a fast decay envelope and for cooperating with said first signal path means to provide a corresponding variable intermediate range of release times when said reference signal has a variable intermediate decay envelope.

2. A circuit according to claim 1, said first signal path means comprising:

grounded capacitive means connected to said output node for storing a charge at said output node;

grounded highly resistive means connected to said intermediate node for dissipating said charge stored at said output node; and a moderately resistive means connected between said intermediate and output nodes.

3. A circuit according to claim 1, said second signal path means comprising a low resistive means connected in series with a second diode means permitting forward conduction from said output node to said input node.

4. A circuit automatically adjustable in response to an input audio signal to provide a dc control signal having the attack and release characteristics of the input audio signal comprising:

an input reference node for receiving a reference signal which is a function of the input signal;

an output reference node for providing the dc control signal;

an intermediate reference node between said input and output reference nodes;

diode means connected between said input and intermediate nodes for permitting forward conduction from said input node to said intermediate node;

a first signal path means connected between said intermediate and output nodes for providing a slow release time when said reference signal has a slow decay envelope and for providing a slow attack time when said reference signal has a slow increase envelope;

a second signal path means connected between said output and input nodes for providing a fast release time when said reference signal has a fast decay envelope and for cooperating with said first signal path means to provide a corresponding variable intermediate range of release times when said reference signal has a variable intermediate decay envelope; and a third signal path means connected between said intermediate and output nodes for providing a fast attack time when said reference signal has a fast increase envelope and for cooperating with said first signal path to provide a corresponding variable intermediate range of attack times when said reference signal has a variable intermediate increase envelope.

5. A circuit according to claim 4, said first signal path means comprising:

grounded capacitive means connected to said output node for storing a charge at said output node;

grounded highly resistive means connected to said intermediate node for dissipating said charge stored at said output node; and a moderately resistive means connected between said intermediate and output nodes.

6. A circuit according to claim 4, said second signal path means comprising a low resistive means connected in series with a second diode means permitting forward conduction from said output node to said input node.

7. A circuit according to claim 4, said third signal path means comprising a low resistive means connected in series with a third diode means permitting forward conduction from said intermediate node to said output node.

8. A circuit automatically adjustable in response to an input audio signal to provide a dc control signal having the release characteristics of the input audio signal comprising:

an input reference node for receiving a reference signal which is a function of the input signal;

an output reference node for providing the dc control signal;

an intermediate reference node between said input and output reference nodes;

first diode means connected between said input and intermediate nodes for permitting forward conduction from said input node to said intermediate node;

grounded capacitive means connected to said output node for storing a charge at said output node;

grounded highly resistive means connected to said intermediate node for dissipating said charge stored at said output node;

a first signal path connected between said intermediate and output nodes having a moderately resistive means cooperable with said highly resistive means for providing a slow release time when said reference signal has a slow decay envelope; and a second signal path connected between said output and input nodes having a low resistive means connected in series with a second diode means permitting forward conduction from said output node to said input node for providing a fast release time when said reference signal has a fast decay envelope and for cooperating with said first signal path to provide a corresponding variable intermediate range of release times when said reference signal has a variable intermediate decay envelope.

9. A circuit automatically adjustable in response to an input audio signal to provide a dc control signal having the attack and release characteristics of the input audio signal comprising:

an input reference node for receiving a reference signal which is a function of the input signal;

an output reference node for providing the dc control signal;

an intermediate reference node between said input and output reference nodes;

first diode means connected between said input and intermediate nodes for permitting forward conduction from said input node to said intermediate node;

grounded capacitive means connected to said output node for storing a charge at said output node;

grounded highly resistive means connected to said intermediate node for dissipating said charge stored at said output node;

a first signal path connected between said intermediate and output nodes having a moderately resistive means cooperable with said highly resistive means for providing a slow release time when said reference signal has a slow decay envelope and for providing a slow attack time when said reference signal has a slow increase envelope;

a second signal path connected between said output and input nodes having a first low resistive means connected in series with a second diode means permitting forward conduction from said output node to said input node for providing a fast release time when said reference signal has a fast decay envelope and for cooperating with said first signal path to provide a corresponding variable intermediate range of release times when said reference signal has a variable intermediate decay envelope; and a third signal path connected between said intermediate and output nodes having a second low resistive means connected in series with a third diode means permitting forward conduction from said intermediate node to said output node for providing a fast attack time when said reference signal has a fast increase envelope and for cooperating with said first signal path to provide a corresponding variable intermediate range of attack times when said reference signal has a variable intermediate increase envelope.

10. A circuit according to claim 9, said second diode means comprising a plurality of diodes.

11. A circuit according to claim 9, said second diode means comprising at least three diodes, the voltage drop across each of said three diodes in a fully saturated condition representing a 7 dB change in the input signal.

12. A circuit according to claim 9, said third diode means comprising at least one diode, the voltage drop across each of said at least one diode in a fully saturated condition representing a 7 dB change in the input signal.

13. A circuit automatically adjustable in response to an input audio signal to provide a dc control signal having the release characteristics of the input audio signal comprising:

means for receiving and amplifying the input signal in response to variations in the voltage thereof to produce an output signal;

means for receiving and converting the input signal into a signal which is a function of the input signal;

an input reference node for receiving said converted signal;

an output reference node for providing the dc control signal;

an intermediate reference node between said input and output reference nodes;

diode means connected between said input and intermediate nodes for permitting forward conduction from said input node to said intermediate node;

a first signal path means connected between said intermediate and output nodes for providing a slow release time when said converted signal has a slow decay envelope; and a second signal path means connected between said output and said input nodes for providing a fast release time when said converted signal has a fast decay envelope and for cooperating with said first signal path means to provide a corresponding variable intermediate range of release times when said converted signal has a variable intermediate decay envelope.

14. A circuit automatically adjustable in response to an input audio signal to provide a dc control signal having the release characteristics of the input audio signal comprising:

an input reference node for receiving a reference signal which is a function of the input signal;

an output reference node for providing the dc control signal;

diode means connected between said input and output nodes for permitting forward conduction from said input node to said output node;

a first signal path means connected to said output node having a grounded capacitive means for storing a charge at said output node and a grounded highly resistive means for dissipating said charge stored at said output node for providing a slow release time when said reference signal has a slow decay envelope; and a second signal path means connected between said output and input nodes for providing a fast release time when said reference signal has a fast decay envelope and for cooperating with said first signal path means to provide a corresponding variable intermediate range of release times when said reference signal has a variable intermediate decay envelope.

15. A circuit according to claim 14, said second signal path means comprising a second diode means permitting forward conduction from said output node to said input node.

16. A circuit automatically adjustable in response to an input audio signal to provide a dc control signal having the release characteristics of the input audio signal comprising:

an input reference node for receiving a reference signal which is a function of the input signal;

an output reference node for providing the dc control signal;

diode means connected between said input and output nodes for permitting forward conduction from said input node to said output node;

a first signal path means connected to said output node having a grounded capacitive means for storing a charge at said output node and a highly resistive means connected to said input node for dissipating said charge stored at said output node for providing a slow release time when said reference signal has a slow decay envelope; and a second signal path means connected between said output and input nodes for providing a fast release time when said reference signal has a fast decay envelope and for cooperating with said first signal path means to provide a corresponding variable intermediate range of release times when said reference signal has a variable intermediate decay envelope.

17. A circuit according to claim 16, said second signal path means comprising a second diode means permitting forward conduction from said output node to said input node.

* * * * *